(12) United States Patent
Curry

(10) Patent No.: US 6,879,518 B1
(45) Date of Patent: Apr. 12, 2005

(54) EMBEDDED MEMORY WITH SECURITY ROW LOCK PROTECTION

(75) Inventor: Duncan Curry, Sunnyvale, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/718,748

(22) Filed: Nov. 21, 2003

(51) Int. Cl.[7] ............................. G11C 16/04; G11C 7/00
(52) U.S. Cl. ..................... 365/185.04; 365/195; 365/196
(58) Field of Search ........................ 365/185.04, 185.33, 365/195, 196; 711/152, 163

(56) References Cited

U.S. PATENT DOCUMENTS

| | | | |
|---|---|---|---|
| 5,642,480 A | * | 6/1997 | Brownlee et al. ........... 365/195 |
| 6,026,016 A | | 2/2000 | Gafken .................. 365/185.04 |
| 6,076,149 A | * | 6/2000 | Usami et al. ............... 711/163 |
| 6,088,262 A | | 7/2000 | Nasu ...................... 365/185.04 |
| 6,229,731 B1 | | 5/2001 | Kasai et al. ........... 365/185.04 |

* cited by examiner

*Primary Examiner*—Son Mai
(74) *Attorney, Agent, or Firm*—Schneck & Schneck; Thomas Schneck; Mark Protsik

(57) ABSTRACT

A memory device having a memory array of nonvolatile memory elements also includes one or more security rows (or columns) of security bits that can be programmed to a locked status. External memory access requests are processed by first reading the corresponding security bit. If the requested row or column is locked, a default zero value is returned. Only external requests of unlocked locations, and all internal access requests, return the actual memory contents. Security bits can be erased (unlocked), but the secured contents of the locked row or column is also erased at the same time.

14 Claims, 1 Drawing Sheet

US 6,879,518 B1

EMBEDDED MEMORY WITH SECURITY ROW LOCK PROTECTION

TECHNICAL FIELD

The present invention relates to semiconductor memory devices and more specifically to a semiconductor memory having a security feature to prevent unauthorized access to the contents of the memory.

BACKGROUND ART

Semiconductor memory devices, such as non-volatile memories and the like, usually include embedded memories, such as the code memory in flash microcontrollers, which may contain proprietary programs that should not be accessible to anyone, especially one's competitors. These embedded memories require security features that allow users to program the contents of the memory, verify the contents of the memory, and then disable the memory from ever being read externally again.

Some prior art methods of protecting the contents of embedded memories include the use of lockbit features that prevent the embedded memory (hereinafter "memory") from being read outside of a device in which it is embedded after locking. The lockbit is a type of programmable, non-volatile memory element that, when programmed or "fused," prevents external READ operations of the memory. Since a non-volatile element is used, it can be written and then erased again, corresponding to locking and unlocking of the memory. It is desirable to have a lock/unlock capability in the memory security features in order to increase manufacturing testability and yield, and to allow reuse and reprogramming by an end-user. Currently, a common method to unlock the device would usually involve the use of a CHIPERASE command, which first erases any proprietary memory contents and then erases the lockbit fuses. In this way, the user may only reach the memory content space after the previous memory contents have been completely erased. However, it has been found that this method is prone to attack and defeat by hackers for a variety of reasons.

U.S. Pat. No. 6,229,731 to Kasai et al., U.S. Pat. No. 6,088,262 to Nasu, and U.S. Pat. No. 6,026,016 to Gufken disclose semiconductor devices having read protect circuits for protecting non-volatile memory arrays. However, in each one of these prior art semiconductor arrays, a read protection circuit is located outside of the main memory array. This does not allow the erase/unlock behavior of the lockbits, or protection circuit, to match the erase behavior of the memory array, which may allow access to the memory content space if the lockbits are unlocked before the memory contents are erased.

It is an object of the present invention to provide a semiconductor memory having a memory protection architecture and algorithm that prevents the defeat of the lockbits and guarantees that the memory contents cannot be read even when the lockbits are defeated.

It is a further object of the present invention to provide a memory protection architecture that is part of the memory array so that the erasing behavior is matched.

SUMMARY OF THE INVENTION

The above objects have been achieved by a semiconductor memory device having a memory array constructed with the addition of one or more security rows within the memory array. The security row is comprised of non-volatile memory elements similar or identical to the non-volatile memory elements in the rest of the memory array. Each element in the security row is connected to the bit line columns ("bit lines") of the memory array just like every other memory element in the array. In addition, there are extra memory elements ("lockbit cells," or "lockbits") in the security row that do not connect to the bit lines of the memory array, but connect to additional security bit line columns ("security bit lines").

In one exemplary embodiment, the elements in the security row can be programmed to an unlocked state in which the elements do not conduct current when the security row is selected, and therefore have no effect on the bit lines or security bit lines, and consequently, no effect on the ability to read the contents of the internal embedded memory elements. Alternatively, the security row elements can be programmed to a locked state in which the security row elements conduct current anytime that the security row is selected. For the security row elements connected to bit lines, selecting the security row causes all I/O sense-amplifier ("sense-amp") outputs to always detect and output a logic zero ("0") value, regardless of the true memory contents of a concurrently selected memory array row. For the security row elements connected to the security bit lines, selecting a security row causes a lockbit sense amplifier ("lockbit sense-amp") to always detect and output a logic zero ("0") value, which corresponds to a lockbit LOCK condition. Logic circuits cause the security row to be selected for external memory read requests. Selection of the security row in parallel with the requested memory row ensures that, while in locked mode, external memory access will return invalid zero-data.

Logic circuits cause the security row to be deselected for internal read requests. De-selection of the security row ensures that internal memory accesses will return valid non-zero data, so that other circuits on the microcontroller can use the data. In addition to selecting the security row in response to memory access requests, logic circuits also cause the security row to be selected at other appropriate times so that the outputs of the lockbit sense-amps can be sampled and latched. The outputs of the lockbit sense-amps determine whether the lockbit cell is written or erased, corresponding to a LOCK or UNLOCK condition. The status of the lockbit cell is then used to enable or disable external memory read and write requests altogether. By disabling all external memory read and write requests due to a LOCK status, an even higher level of embedded memory security is achieved.

Incorporating security rows with bit line elements, security bit line elements, or a combination of the two, increases the overall level of embedded memory security, and reduces the ability of hackers to gain access to the embedded memory data contents.

To unlock and reuse a locked device, the security row can be erased back to the unlock state by a CHIPERASE command in a single or multiple chip erase programming mode. The CHIPERASE command erases and/or destroys the embedded memory data contents. Because the memory elements, logic, and programming circuits are similar or identical for both the security row and the other memory elements in the memory array, and because the security row is located among the other memory array elements, the security row is guaranteed to be erased in the same manner and at the same time as the other embedded memory elements during the chip erase cycle. To further guarantee that the memory array is erased before the security row elements are erased, the CHIPERASE command is executed in two or more steps. For example, the first step consists of erasing all memory elements in the array except those memory elements in the security row. Subsequent steps erase all the memory elements in the array, including some or all memory elements in the security row. This subsequent step ensures that the security row will be erased and unlocked only after the secured contents of the embedded memory elements have previously been erased and destroyed. Conversely, the embedded memory element contents can be accessed only after the security row memory elements have been erased, which is at a time after the embedded memory contents have been erased. A situation will not occur where the security row memory elements have been erased/unlocked, yet the original embedded memory contents have not been erased but are intact and readable. Regardless of the hacking technique used, the memory contents will be secure from read until both the memory array elements and security row have been erased.

BEST MODES FOR CARRYING OUT THE INVENTION

Figure 1:
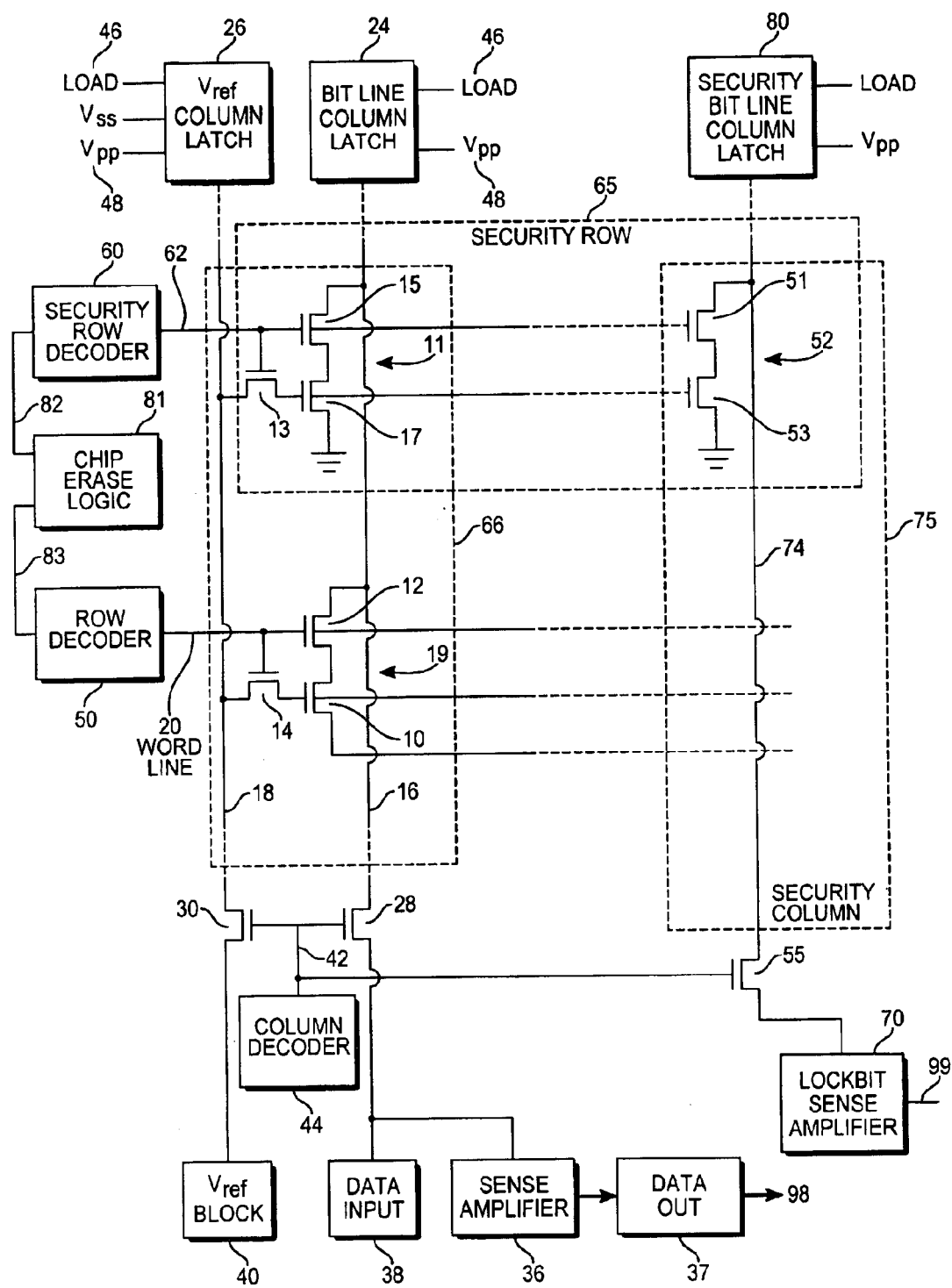
FIG. 1 is a circuit block diagram showing an embodiment of the semiconductor memory array structure of the present invention.

With reference to FIG. 1, a semiconductor memory incorporating an exemplary embodiment of the present invention is shown. The semiconductor memory element shown in FIG. 1 is an electrically erasable and programmable non-volatile memory cell (EEPROM), but the invention can be implemented by one of ordinary skill into other types of non-volatile memory cells, such as, for example, a flash memory cell. In the EEPROM array of FIG. 1, each floating gate transistor 10 is paired up with an access transistor 12, forming a memory cell 19, in which the source of the access transistor 12 is connected to the drain of the floating gate transistor 10. Each of the memory cells are arranged into a memory array structure, with the various bit lines 16 and word lines 20 arranged in an array as shown in FIG. 1. The drain of the access transistor 12 taps into a bit line 16 that is common to the drains of all of the access transistors 12 in the same column 66. A bit line column latch 24 is connected to one end of the bit line 16 and a bit line select transistor 28 is connected to the other end. The gate of the access transistor 12 is connected to a word line 20 that is common to the gates of all of the access transistors in the same row.

A row decoder 50 is connected to each of the word lines 20 of the memory array and selects the appropriate word line of the memory cell 19 that is to be written, erased, or read. The floating gate transistors 10 in each row are typically subdivided into page, word, or byte size groups and the gates of the floating gate transistors 10 in each group are connected to the source of a word select transistor 14. The gate of the word select transistor 14 is connected to the word line 20. The drain of the word select transistor 14 connects to a $V_{ref}$ line 18 that provides a stable reference voltage to the memory cell during read, or $V_{pp}$ during erase, or $V_{SS}$ during write. One end of the $V_{ref}$ line 18 is connected to a $V_{ref}$ column latch 26 and the other end is connected to a transistor 30 that is controlled by a column address decoder 44. The bit line select transistor 28 serves to receive instructions from the column decoder 44 to select the appropriate bit line connected to the memory cell 19 that is to be programmed, read, or erased. A sense amplifier 36 includes electronic circuitry that serves to detect the status of memory cell 19 connected to bit line 16 when bit line select transistor is selected by column decoder 44, and when access transistor 12 is selected by row decoder 50, during a read operation.

The write, erase, and read operations of an EEPROM cell are well known to one of ordinary skill in the art, and will not be described further herein.

In this exemplary embodiment of the present invention, a security row 65 and a security column 75 have been added to the standard memory array structure described above. In this embodiment, one security row 65 and one security column 75 are shown, however, multiple security rows and columns can be implemented in to an array, if so desired. Each memory cell 11 in the security row 65 consists of a floating gate transistor 17 and an access transistor 15, arranged similarly as described above with respect to the floating gate transistor 10 and the access transistor 12. The floating gate transistor 17 in each group are connected to the source of a word select transistor 13. The security row word line 62 is connected to a security row decoder 60, and each memory cell in the security row is connected to a corresponding bit line 16, as described above.

Additionally, the memory array includes a security column 75 connected to a security bit line column latch 80. The security column includes a lockbit cell 52 consisting of an access transistor 51 and a floating gate transistor 53, connected to the security bit line 74 in the same manner as the other memory cells in the security row described above. A select transistor 55 in the security bit line 74 has a gate terminal connected to the column decoder 44 of the memory array, a drain terminal connected to the lockbit cell 52 (i.e., the drain of the access transistor 51) and a source terminal connected to a lockbit sense amplifier 70. The lockbit sense amplifier 70 may be, for example, similar in construction to the sense amplifier 36.

When programmed to lock mode, the memory cell 11 and lock bit cell 52 will sink current whenever the security row 65 is selected. The security row 65 is selected when the security row decoder 60 sends a select signal to the security word line 62. The security row 65 is selected whenever an external read operation, but not an internal read operation, is requested of the memory cell 19, and the word line 20 and the column address 42 are concurrently selected. Regardless of a conducting or non-conducting state of memory cell 19, the sense amplifier 36 will output a logic "0" because of the selected and conducting security row memory cell 11. Therefore, a true data content of the memory cell 19 will not be available for an external read when the security row memory cell 11 is programmed to lock mode. Furthermore, the security row 65 is selected and the column address 42 are selected at other appropriate times so that the conducting state of the lockbit cell 52 is detected and output as a logic "0" by the lockbit sense amplifier 70. A signal at an output 99 is then sampled, latched, and used to deny external memory access requests.

When programmed to unlock mode, the memory cell 11 and the lock bit cell 52 will not sink current whenever the security row 65 is selected. When an external read operation is requested of the memory cell 19 and the word line 20 and the column address 42 are selected, the security row 65 will be selected. Since the memory cell 11 is non-conducting, the output of sense-amplifier 36 will be determined solely by the conducting or non-conducting state of memory cell 19. Therefore, the true data content of the memory cell 19 is available for an external read when the security row memory cell 11 is programmed to unlock mode. Furthermore, when the security row 65 and the column address 42 are selected at other appropriate times, the non-conducting state of the lockbit cell 52 is detected and output as a logic "1" by the lockbit sense amplifier 70 so that the signal at the output 99 can be sampled, latched, and used to allow external memory access requests.

The algorithm for the CHIPERASE sequence for programming the unlock mode is implemented by a chiperase logic circuit 81. The chiperase logic circuit 81 sends out an enable signal on output line 83 to the row decoder 50 allowing row selection during the first phase of the CHIPERASE operation. At this time, an enable signal on output line 82 is not sent out to the security row decoder 60, so security row selection is not allowed during the first phase of the CHIPERASE operation. This allows time for the embedded memory elements to be erased while the security row elements are not erased. After some time of erasing, the chiperase logic circuit 81 sends out both enable signals on the output lines 82 and 83, allowing row selection of both embedded memory array elements and security row elements. This allows for continued erasing of the embedded memory elements, and for the start of erasing of security row elements. After sufficient time in which both the embedded memory elements and the security row elements are erased, the CHIPERASE operation ceases.

Although the detailed description and drawings describes an embedded memory device with security row lock protection, one skilled in the art will recognize that other embodiments can readily be contemplated without departing from the intended scope of the device described. For example, a skilled artisan could envision a plurality of security rows distributed across a memory array. Therefore, the scope of the present invention shall only be limited by the appended claims.

What is claimed is:

1. A semiconductor memory comprising:
   an array of first memory elements including bit lines coupled with corresponding columns of elements in the array and word lines coupled with corresponding rows of elements in the array, each of the first memory elements holding data, said array further including a security row of second memory elements coupled to a corresponding security word line, each of the second memory elements being coupled to the bit lines of the array of first memory elements, said second memory elements being programmed in a first mode of operation to allow the data in the first memory elements to be read, said second memory elements being programmed in a second mode of operation to prevent the data in the first memory elements from being read; and
   means for selecting the security row to operate in either the first mode of operation or the second mode of operation.

2. The semiconductor memory of claim 1 wherein the security row is selected for read when an external read command is requested and deselected when an internal read command is requested.

3. The method of claim 1 wherein the second mode of operation includes returning a default zero value in response to an external read request of said memory.

4. The semiconductor memory of claim 1 wherein the means for selecting includes a chip erase command to program the second memory elements to operate in the first mode of operation.

5. The semiconductor memory of claim 1 wherein the means for selecting includes a write lockbit command to program the second memory elements to operate in the second mode of operation.

6. The semiconductor memory of claim 1 further including a security row of third memory elements coupled to a corresponding security bit line, each of the third memory elements coupled to the word lines of the array of the second memory elements, said third memory elements being programmed in a first mode of operation to allow the data in the first memory elements to be read, said third memory elements being programmed in a second mode of operation to prevent the data in the first memory elements from being read.

7. The semiconductor memory of claim 6 further comprising means for erasing of the first memory elements followed the second and third memory elements such that the previous data contents are destroyed before the second and third memory elements operate in the first mode of operation.

8. The semiconductor memory of claim 6 wherein the security row of third memory elements is selected for reading at appropriate times so as to determine a mode of operation of the third memory elements.

9. The semiconductor memory of claim 1 further comprising a plurality of security rows distributed across the array.

10. A method of operating an embedded semiconductor memory comprising:
    having security lock protection responsive to an external access request to said memory; and
    disabling external access to a memory array row whenever a security bit in a security row indicates a locked status, and otherwise enabling access to the memory array.

11. The method of claim 10 wherein internal access is enabled regardless of locked/unlocked status.

12. The method of claim 10 further comprising erasing memory contents of said memory prior to resetting security row memory cell elements and lock bit cells to an unlocked status.

13. The method of claim 10 wherein a chip erase command erases and unlocks all security bits at the same rate and in the same manner as all elements in the memory array are erased.

14. The method of claim 10 wherein a lockbit sense amplifier is selected to detect and latch the locked or unlocked status of the lockbit cells.

* * * * *